US012615048B2

(12) United States Patent
Tran et al.

(10) Patent No.: US 12,615,048 B2
(45) Date of Patent: Apr. 28, 2026

(54) VOLTAGE LEVEL SHIFTERS AND OUTPUT DRIVER INCLUDING VOLTAGE LEVEL SHIFTERS FOR LOW POWER RESET AND HOLD

(71) Applicant: GlobalFoundries U.S. Inc., Malta, NY (US)

(72) Inventors: Dzung T. Tran, Austin, TX (US); Navneet K. Jain, Milpitas, CA (US); Uttam Saha, San Jose, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 119 days.

(21) Appl. No.: 18/792,689

(22) Filed: Aug. 2, 2024

(65) Prior Publication Data

US 2026/0039300 A1 Feb. 5, 2026

(51) Int. Cl.
H03K 19/0185 (2006.01)
H03K 3/037 (2006.01)
H03K 17/22 (2006.01)

(52) U.S. Cl.
CPC ..... H03K 19/018521 (2013.01); H03K 3/037 (2013.01); H03K 17/223 (2013.01)

(58) Field of Classification Search
None
See application file for complete search history.

(56) References Cited

U.S. PATENT DOCUMENTS

| | | | |
|---|---|---|---|
| 10,326,431 B1 * | 6/2019 | Patel | H03K 3/356113 |
| 10,637,463 B2 | 4/2020 | Wang | |
| 10,651,832 B2 * | 5/2020 | Chen | H03K 17/6871 |
| 10,686,438 B2 | 6/2020 | Yu et al. | |
| 10,735,000 B1 | 8/2020 | Tran et al. | |
| 11,005,454 B1 | 5/2021 | Tran et al. | |
| 12,015,407 B1 * | 6/2024 | Panigrahi | H03K 19/0175 |
| 12,101,089 B2 * | 9/2024 | Zhang | H03K 19/017 |

* cited by examiner

*Primary Examiner* — Jeffrey S Zweizig
(74) *Attorney, Agent, or Firm* — David Cain; Hoffman Warnick LLC

(57) ABSTRACT

Disclosed are voltage level shifters and an output driver including them. Each voltage level shifter includes an input section with first and second intermediate nodes and an output section connected thereto. Each voltage level shifter is configured to achieve desired outputs particularly when a voltage rail in a high voltage domain is powering up but a voltage rail in a low voltage domain is at 0.0V or when the voltage rail in the high voltage domain is powered up and the voltage rail in the low voltage domain is powering down. To achieve the desired outputs, the output section includes, among other components, two output stabilizing transistors series-connected to the second intermediate node and having gates connected to the first intermediate node and a feedback node, respectively. The input section includes, among other components, a pull-down transistor connected to the first intermediate node and controlled by the second intermediate node.

20 Claims, 9 Drawing Sheets

Time (t)

Time (t)

VOLTAGE LEVEL SHIFTERS AND OUTPUT DRIVER INCLUDING VOLTAGE LEVEL SHIFTERS FOR LOW POWER RESET AND HOLD

BACKGROUND

The present disclosure relates to circuit structures and, more particularly, to embodiments of voltage level shifters and to embodiments of an output driver including voltage level shifters.

Generally, in a general purpose input/output (GPIO), an output driver receives a data signal, which has been generated on-chip and switches between 0.0V and a relatively low positive supply voltage level (VDDL), and outputs a boosted data output signal, which switches between 0.0V and a relatively high positive supply voltage level (VDDH) for transmission off-chip. Thus, the output driver operates in two different voltage domains. Typically, the output driver includes a data signal node, which is connected to receive the data signal. The output driver further includes: control logic connected to the data signal node; a pull-up path connected between the control logic and an output pad; and a pull-down path also connected between the control logic and the output pad. The control logic can apply the data signal to the paths. Each of these paths can include a voltage level shifter, a pre-driver, and a main driver. In the pull-up path, these components can be configured to pull the voltage level on the output pad up to VDDH when the data signal on the data signal node goes high (i.e., to VDDL). In the pull-down path, these components can be configured to pull the voltage level on the output pad down to 0.0V when the data signal on the data signal node goes low. In currently available output drivers, operating restrictions mandate the order in which the voltage rails for the different voltage domains (i.e., for the VDDL and VDDH domains) are powered down and powered up in order to prevent shoot-through currents from occurring in the output driver and, particularly, in the main drivers. For example, VDDL must be powered up before VDDH and can only be powered down after VDDH. Applying the restrictions requires complex power control circuitry, but without these restrictions the resulting shoot-through currents may lead to increased power consumption and chip package damage.

SUMMARY

Disclosed herein are voltage level shifters and an output driver including such voltage level shifters for low power reset and hold.

More particularly, embodiments of a voltage level shifter disclosed herein can include an input section and an output section. The input section can have a first intermediate node and a second intermediate node. The output section can be connected to the first and second intermediate nodes. Specifically, the output section can include: an inverter, which is connected in series between the second intermediate node and a feedback node; and a two transistors, which are connected in series between the second intermediate node and a ground rail. In this output section, gates of the two transistors can be connected to the first intermediate node and the feedback node, respectively.

Embodiments of an output driver disclosed herein can include an output path and both a pull-up path and a pull-down path connected to the output path. The pull-up path can include a first voltage level shifter, a first pre-driver, and a first main driver. Similarly, the pull-down path can include a second voltage level shifter, a second pre-driver, and a second main driver. The first voltage level shifter in the pull-up path and the second voltage level shifter in the pull-down path can each include an input section and an output section. The input section can have a first intermediate node and a second intermediate node. The output section can be connected to the first and second intermediate nodes. Specifically, the output section can include: an inverter, which is connected in series between the second intermediate node and a feedback node; and a two transistors, which are connected in series between the second intermediate node and a ground rail. In this output section, gates of the two transistors can be connected to the first intermediate node and the feedback node, respectively.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, in currently available output drivers, operating restrictions mandate the order in which the voltage rails for the different voltage domains (i.e., for the VDDL and VDDH domains) are powered down and powered up in order to prevent shoot-through currents from occurring in the output driver and, particularly, in the main drivers. For example, VDDL must be powered up before VDDH and can only be powered down after VDDH. Applying the restrictions requires complex power control circuitry, but without these restrictions the resulting shoot-through currents may lead to increased power consumption and chip package damage.

In view of the foregoing, disclosed herein are voltage level shifters and an output driver including the voltage level shifters for low power reset and hold. The output driver can include pull-up and pull-down paths each including a voltage level shifter, a pre-driver, and a main driver. Each voltage level shifter can include an input section with first and second intermediate nodes and an output section connected thereto. Each voltage level shifter can be configured with extra transistors in the input and output sections (as compared to conventional voltage level shifters) in order to achieve desired outputs: (a) when voltage rails in high and low voltage domains are powered up; (b) when the voltage rail in the high voltage domain is powering up but the voltage rail in the low voltage domain is still at 0.0V, and (c) when the voltage rail in the high voltage domain is powered up and the voltage rail in the low voltage domain is powering down to 0.0V. To achieve the desired outputs, the output section can include, among other components, a two transistors, which are connected in series between the second intermediate node and a ground rail and which have gates connected to the first intermediate node and a feedback node, respectively (e.g., to provide output stabilization). Additionally, the input section can include, among other components, an additional pull-down transistor connected in series between the first intermediate node and ground and controlled by the voltage level on the second intermediate node. As discussed in greater detail below, the specific configurations for voltage level shifters to be included in pull-up and pull-down paths will vary somewhat due to different desired outputs. In any case, by including such voltage level shifters in the pull-up and pull-down paths of the output driver, operating restrictions that mandate the order in which voltage rails for different voltage domains (i.e., VDDL and VDDH) must be powered down and/or powered up can be eliminated.

Figure 1:
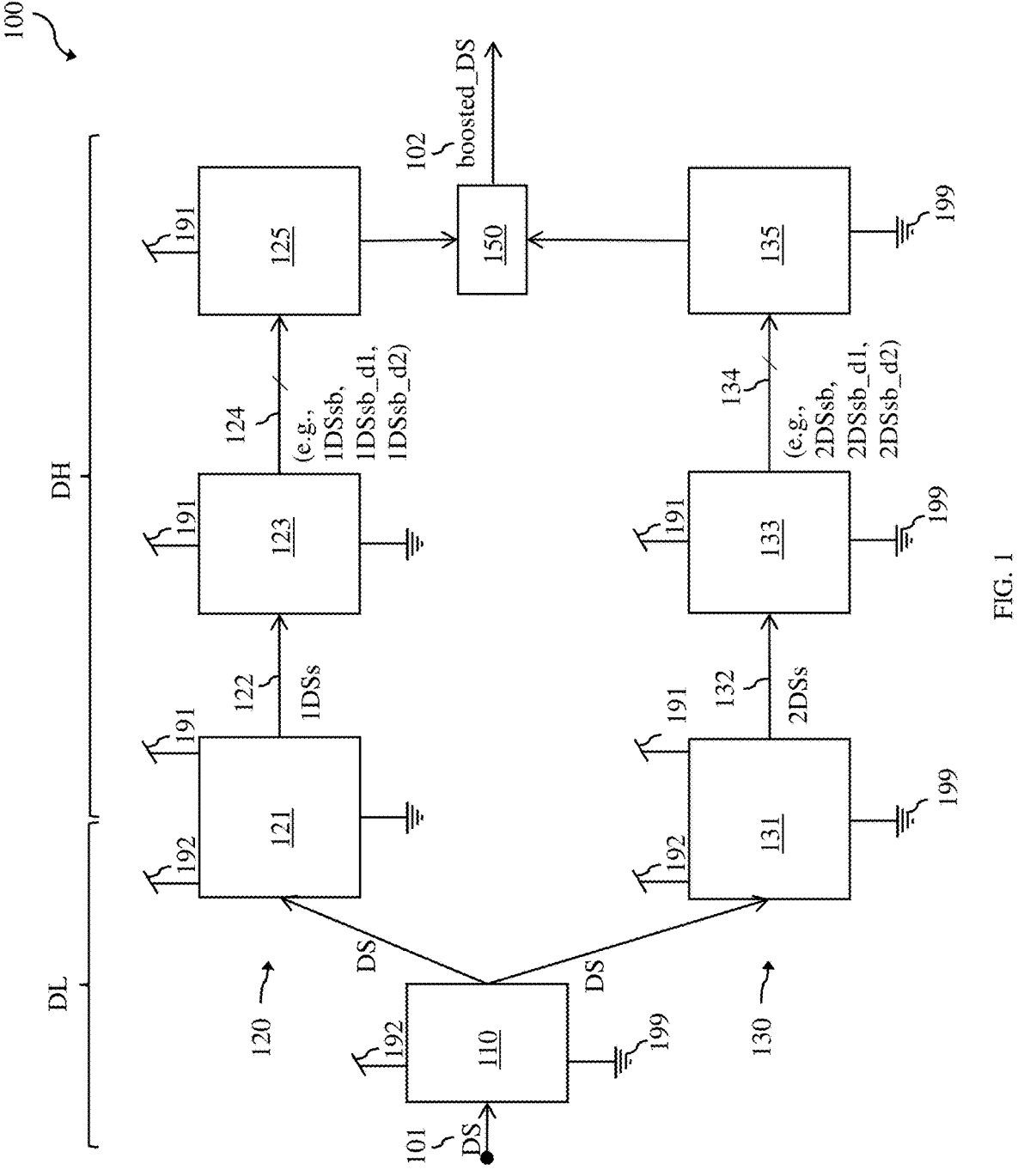
FIG. 1 is a schematic diagram illustrating disclosed embodiments of an output driver including disclosed voltage level shifter embodiments in the pull-up and pull-down paths.

More particularly, FIG. 1 is a schematic diagram illustrating disclosed embodiments of an output driver 100 (e.g., for inclusion in a general purpose input/output (GPIO)). Output driver 100 can, as discussed in greater detail below, be configured to receive a data signal (DS) 101, which has, for example, been generated on-chip and which switches between 0.0V and a relatively low positive supply voltage level, and to further output a boosted data signal (boosted_DS) 102, which switches between 0.0V and a relatively high positive supply voltage level for transmission off-chip.

Output driver 100 can operate in two different voltage domains and, particularly, a first or high voltage domain (DH) and a second or low voltage domain (DL). The high voltage domain can include a first voltage rail 191. A first voltage on first voltage rail 191 can be chargeable from 0.0 volts (V) (when powered down) to a first positive supply voltage level (also referred to as a high positive supply voltage (VDDH)) when powered up. The low voltage domain can include a second voltage rail 192. A second voltage on second voltage rail 192 can be chargeable from 0.0 volts (V) (when powered down) to a second positive supply voltage level (also referred to as a low positive supply voltage (VDDL)) when powered up. In some embodiments, VDDH can be 1.8V and VDDL can be 0.8V. Alternatively, VDDH and VDDL could be set to any suitable high and low positive supply voltage levels given the operating specifications of the GPIO and application for which output driver 100 is employed.

Output driver 100 can be connected to receive a data signal 101 that switches between a low signal at 0.0V and a high signal at VDDL and can further be configured so that, when in an operational mode, it outputs a boosted data signal 102 (boosted_DS) that switches between a low signal at 0.0V and a high signal at VDDH (as the data signal switches). That is, if data signal 101 goes low, boosted data signal 102 goes low and vice versa. To accomplish such signal boosting during an operational mode, output driver can include: control logic 110, which is connected to receive data signal 101 (e.g., at a data signal node; a pull-up path 120, which is connected is connected to receive data signal 101 from control logic 110 and which is configured to pull the voltage level on output pad 150 up to VDDH when data signal 101 goes high; and a pull-down path 130, which is connected to receive data signal 101 from control logic 110 and which is configured to pull the voltage level on output pad 150 down to 0.0V when data signal 101 goes low.

More specifically, control logic 110 can operate in the low voltage domain (i.e., can be connected to second voltage rail 192 and a ground rail 199) and can be configured to selectively apply data signal 101 to the pull-up and pull-down paths 120, 130. Such control logic 110 is known in the art and, thus, the details thereof have been omitted from the specification to allow the reader to focus on the salient aspects of the disclosed embodiments (e.g., related to the voltage level shifter structures discussed in greater detail below).

Pull-up and pull-down paths 120, 130 can each include: a voltage level shifter 121, 131 connected to control logic 110; a pre-driver 123, 133 connected to voltage level shifter 121, 131; and a main driver 125, 135 connected between pre-driver 123, 133 and output pad 150. Specifically, pull-up path 120 can include a first voltage level shifter 121, which is connected to control logic 110 for receiving data signal 101 and which is configured to up-shift data signal 101 from the low voltage domain to the high voltage domain and, particularly, to generate and output a first level-shifted data signal (1DSs) 122 that switches between 0.0V and VDDH as data signal 101 switches between 0.0V at VDDL. Pull-up path 120 can further include a first pre-driver 123, which is connected to receive first level-shifted data signal 122 and configured to generate and output one or more first pre-driver signals 124 based thereon (as discussed in greater detail below); and a first main driver 125, which is connected to receive first pre-driver signal(s) 124 and, depending upon the voltage level thereof, pull-up the voltage level of boosted data signal 102 on output pad 150. Pull-down path 130 can include a second voltage level shifter 131, which is connected to control logic 110 for receiving data signal 101 and which is configured to up-shift data signal 101 from the low voltage domain to the high voltage domain and, particularly, to generate and output a second level-shifted data signal (2DSs) 132 that switches between 0.0V and VDDH as data signal 101 switches between 0.0V at VDDL. Pull-down path 130 can further include a second pre-driver 133, which is connected to receive second level-shifted data signal 132 and configured to generate and output one or more second pre-driver signals 134 based thereon (as discussed in greater detail below); and a second main driver 135, which is connected to receive second pre-driver signal(s) 134 and, depending upon the voltage level thereof, pull-down the voltage level of boosted data signal 102 on output pad 150.

The first and second pre-drivers 123 and 133 can operate in the high voltage domain (i.e., can be connected to first voltage rail 191 and ground rail 199) and can have essentially the same configurations. For example, first and second pre-drivers 123, 133 can be connected to receive first and second level-shifted data signals 122, 132 from first and second voltage level shifters 121, 131, respectively. Furthermore, first and second pre-drivers 123, 133 can each include at least one inverter for outputting at least one pre-driver signal and particularly at least one inverted level-shifted data signal (DSsb).

Figure 2:
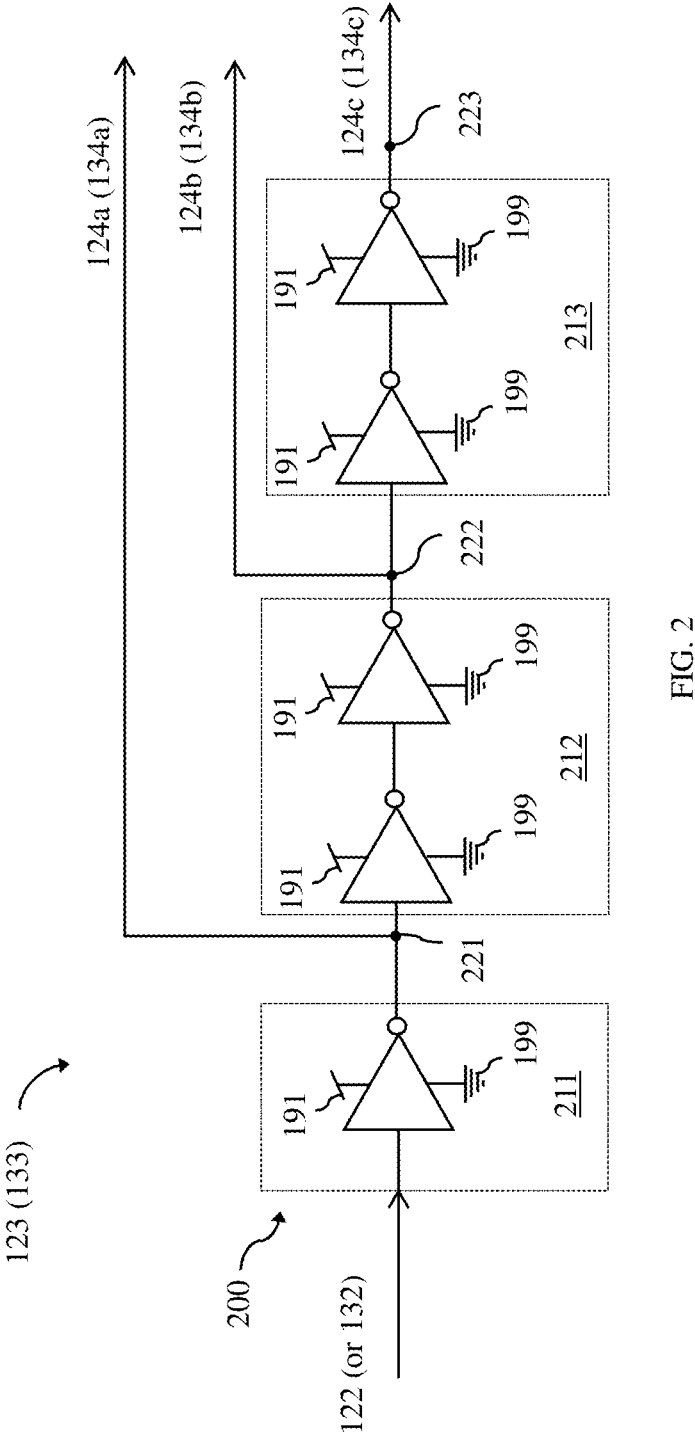
FIG. 2 is a schematic diagram illustrating an example of a pre-driver for a pull-up path or a pull-down path.

FIG. 2 is a schematic diagram illustrating an example of a pre-driver. An instance of this pre-driver could be incorporated into pull-up path 120 as first pre-driver 123 and another instance of this pre-driver could be incorporated into pull-down path 130 as second pre-driver 133. Pre-driver 123, 133 can include an inverter chain 200 with a single-inverter first stage 211, a double-inverter second stage 212, and a double inverter third stage 213. Pre-driver 123, 133 can further include taps 221-223 after stages 211-213, respectively. Thus, first pre-driver 123 generates and outputs three different first pre-driver signals in response to first level-shifted data signal 122. These first pre-driver signals include an inverted first level-shifted data signal (1DSsb), and two different delayed inverted first level-shifted data signals 124b-124c (1DSsb_d1 and 1DSsb_d2). Similarly, second pre-driver 133 generates and outputs three different second pre-driver signals in response to second level-shifted data signal 132. These second pre-driver signals include an inverted second level-shifted data signal 134a (2DSsb) and two different delayed inverted second level-shifted data signals 134b-134c (2DSsb_d1 and 2DSsb_d2). Alternatively, first and second pre-drivers 123, 133 could have any other suitable configuration for generation of such pre-driver signals (e.g., using FETs with different channel lengths, where FETs with longer channel lengths are used to achieve longer delays, etc.). It should be understood that the pre-driver structure shown in FIG. 2 is provided for illustration and is not intended to be limiting.

First and second main drivers 125 and 135 can operate in the high voltage domain (i.e., can be connected to first voltage rail 191 and ground rail 199) and, as discussed below, can have different configurations in order to achieve the pull-up and pull-down functions in each path.

Specifically, first main driver 125 can include at least one P-type field effect transistor (PFET) having a source region connected to first voltage rail 191 and a drain region connected to output pad 150. A gate of the PFET can be connected to receive a first pre-driver signal 124 from first pre-driver 123. Thus, when the first pre-driver signal 124 is high (i.e., at VDDH), the PFET will remain off, whereas when the first pre-driver signal 124 is low (i.e., at 0.0V), the PFET can switch on, thereby pulling the voltage level of the boosted data signal 102 on output pad up to VDDH. Contrarily, second main driver 135 can include at least one N-type field effect transistor (NFET) having a source region connected to a ground rail 199 and a drain region connected to output pad 150. A gate of the NFET can be connected to receive a second pre-driver signal 134 from second pre-driver 133. Thus, when the second pre-driver signal 134 is low (i.e., at 0.0V), the NFET will remain off, whereas when the second pre-driver signal 134 is high (i.e., at VDDH), the NFET can switch on, thereby pulling the voltage level of the boosted data signal 102 on output pad 150 down to 0.0V.

Figure 3:
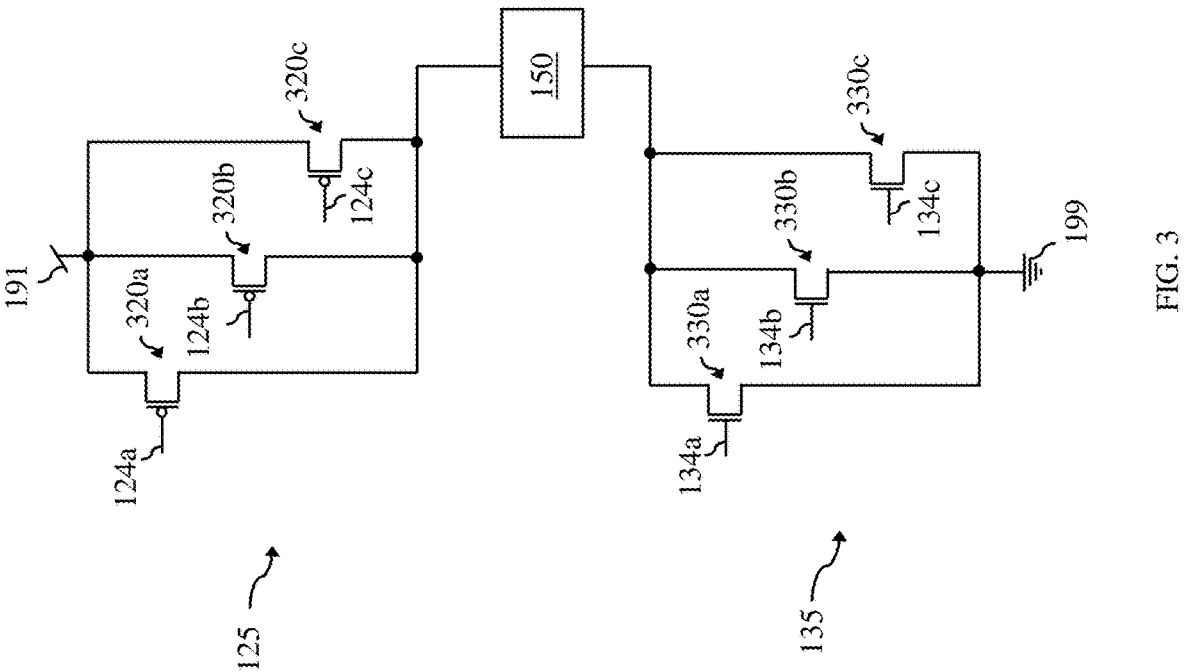
FIG. 3 is a schematic diagram illustrating examples of different main drivers for pull-up and pull-down paths.

FIG. 3 is a schematic diagram illustrating examples of first and second main drivers 125 and 135, which can be incorporated into output driver 100 of FIG. 1 along with the example first and second pre-drivers 123 and 133 shown in FIG. 2. In this case, first main driver 125 can include three PFETs 320a-320c, which are connected in parallel between first voltage rail 191 and output pad 150. Gates of PFETs 320a-320c can be connected to receive first pre-driver signals 124a-124c, respectively. Due to the delay between first pre-driver signals 124a-124c, PFETs 320a-320c turn on sequentially as first pre-driver signals 124a-124c go low, thereby reducing switching noise, etc. Similarly, second main driver 135 can include three NFETs 330a-330c, which are connected in parallel between ground rail 199 and output pad 150. Gates of NFETs 330a-330c can be connected to receive second pre-driver signals 134a-134c, respectively. Due to the delay between second pre-driver signals 134a-134c. NFETs 330a-330c turn on sequentially as second pre-driver signals 134a-134c go high, thereby reducing switching noise, etc.

The pre-driver and main driver structures shown in FIGS. 2 and 3 are provided for illustration and are not intended to be limiting. Various different pre-driver and main-driver structures that can be incorporated into pull-up and pull-down paths of an output driver are known in the art and, thus, the details thereof have been omitted from the specification in order to allow the reader to focus on the salient aspects of the disclosed embodiments (e.g., related to the voltage level shifter structures discussed in greater detail below).

As mentioned above, first voltage level shifter 121 within the pull-up path 120 and second voltage level shifter 131 within the pull-down path 130 both operate to up-shift data signal 101 from the low voltage domain to the high voltage domain. Thus, first and second voltage level shifters 121 and 131 are each connected to first voltage rail 191, second voltage rail 192, and ground rail 199. First and second voltage level shifters 121, 131, each have an input section connected to receive a data signal 101 that switches between 0.0V and VDDL and an output section that outputs a level-shifted data signal (DSs) that switches between 0.V and VDDH. However, first voltage level shifter 121 and second voltage level shifter 131 have somewhat different configurations, as discussed below, not only to achieve the desired pull-up and pull-down functions in output driver 100 during an operational mode (e.g., when the first and second voltage rails 191 and 192 in the high and low voltage domains are both fully powered up), but also to prevent shoot-through currents from occurring in the first and second main drivers 125, 135 (e.g., when restrictions are not placed on the order in which first and second voltage rails 191-192 are powered down and powered up). That is, as mentioned above, conventional output drivers operate under restrictions to avoid shoot-through currents from occurring in the main drivers. For example, second voltage rail 192 must be powered up to VDDL before first voltage rail 191 is powered up to VDDH and first voltage rail 191 must be powered down to 0.0V before the second voltage rail 192 is powered down to 0.0V. In the disclosed embodiments, first and second voltage level shifters 121, 131 are uniquely configured with an additional pull-down transistor in the input section and a pair of output stabilizing transistors in the output section to avoid the need for operating under these restrictions.

Figure 4:
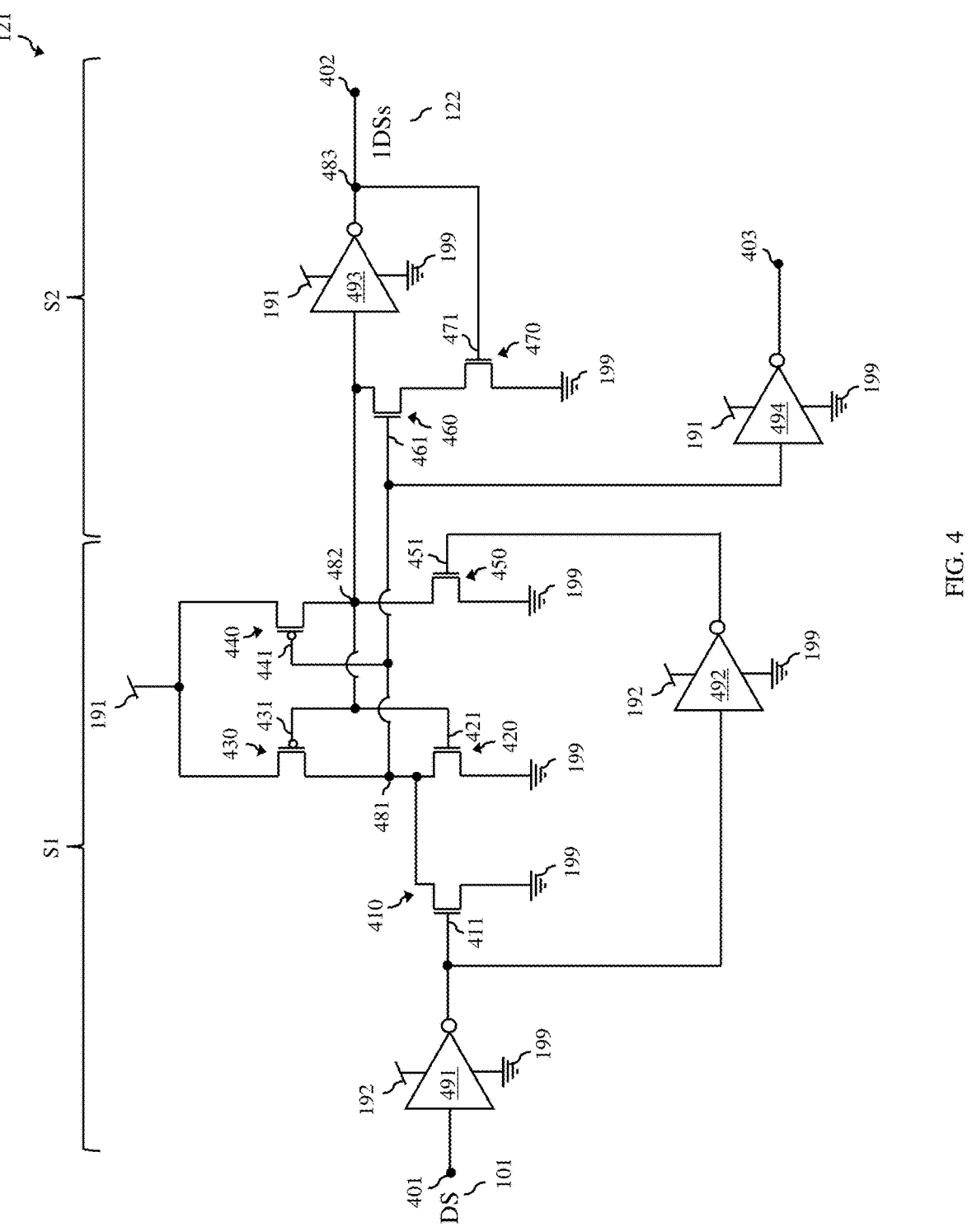
FIG. 4 is a schematic diagram illustrating an embodiment of a voltage level shifter that can be incorporated into a pull-up path of the output driver of FIG. 1.
Figure 5:
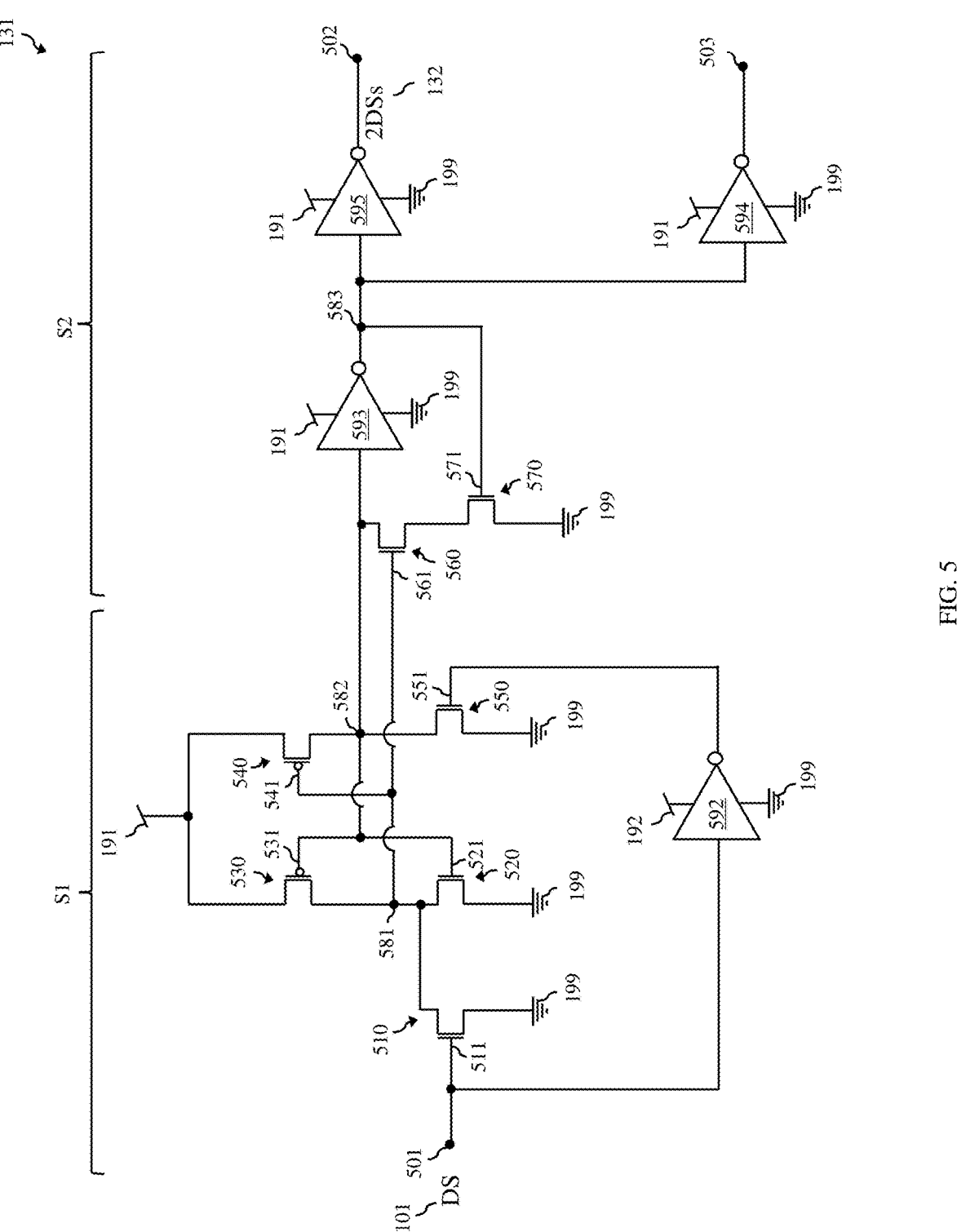
FIG. 5 is a schematic diagram illustrating an embodiment of a voltage level shifter that can be incorporated into a pull-down path of the output driver of FIG. 1.

For example, FIGS. 4 and 5 are schematic diagrams illustrating disclosed embodiments of first and second voltage level shifters 121 and 131, respectively, which can be incorporated into the pull-up and pull-down paths 120 and 130, respectively, of output driver 100 of FIG. 1 so that the operating restrictions mentioned above are not required.

Referring to FIG. 4, first voltage level shifter 121 can include an input section (S1) with an input node 401 (also referred to herein as a data signal node or data signal input node) connected to receive data signal 101 (DS) (which switches between 0.0V and VDDL) and an output section (S2) with an output node 402 that outputs a first level-shifted data signal (1DSs) (which switches from 0.0V and VDDH as DS switches from 0.0V and VDDL and vice versa).

S1 can include: a first PFET 430; a second PFET 440; a first NFET 410; a second NFET 420; and a third NFET 450. First PFET 430 can include at least: a source region electrically connected to first voltage rail 191 (which, when powered up is at VDDH); a drain region electrically connected to a first intermediate node 481; a channel region between the source region and the drain region; and a gate 431 adjacent to the channel region. First NFET 410 and second NFET 420 can be connected in parallel between first intermediate node 481 and a ground rail 199. That is, first NFET 410 can include at least: a source region electrically connected to ground rail 199; a drain region electrically connected to first intermediate node 481; a channel region between the source region and the drain region; and a gate 411 adjacent to the channel region. Second NFET 420 can include at least: a source region electrically connected to ground rail 199; a drain region electrically connected to first intermediate node 481; a channel region between the source region and the drain region; and a gate 421 adjacent to the channel region. Second PFET 440 can include at least: a source region electrically connected to first voltage rail 191; a drain region electrically connected to a second intermediate node 482; a channel region between the source region and the drain region; and a gate 441 adjacent to the channel region. Third NFET 450 can include at least: a source region electrically connected to ground rail 199; a drain region electrically connected to second intermediate node 482; a channel region between the source region and the drain region; and a gate 451 adjacent to the channel region.

S1 can further a pair of inverters 491-492 connected in series (referred to herein as a first additional inverter 491 and a second additional inverter 492). Those skilled in the art will recognize that an inverter is a device including: a PFET and an NFET connected in series between a power supply and ground; an input terminal connected to the gates of the PFET and NFET; and an output terminal at an interconnect that connects the drain regions of the PFET and NFET. With such a device, if an input signal at the input terminal is low, an output signal at the output terminal will be pulled high (e.g., to the voltage level of the power supply); whereas, if the input signal at the input terminal is high, the output signal at the output terminal will be pulled low (e.g., to ground or 0.0V). First additional inverter 491 and second additional inverter 492 can each be connected between second voltage rail 192 (which, when powered up is at VDDL, and ground rail 199).

Within S1, an input terminal of first additional inverter 491 can be connected to a data signal node 401 for receiving data signal (DS) 101 (which, as mentioned above, switches between 0.0V and VDDL). The gate 411 of first NFET 410 can be electrically connected to the output terminal of first additional inverter 491. The gate 451 of third NFET 450 can be electrically connected to the output terminal of second additional inverter 492. The gate 421 of second NFET 420 and the gate 431 of first PFET 430 can be electrically connected to second intermediate node 482. The gate 441 of second PFET 440 can be electrically connected to first intermediate node 481.

S2 includes: inverter 493, which is electrically connected in series between second intermediate node 482 and output node 402 and further connected to first voltage rail 191 and ground rail 199; a feedback node 483 between the output terminal of inverter 493 and output node 402; and two transistors 460 and 470 (also referred to herein as output stabilizing transistors), which are connected in series between second intermediate node 482 and ground rail 199. The output stabilizing transistors can be pull-down transistors and can include a fourth NFET 460 and a fifth NFET 470. Fourth NFET 460 can include at least: a source region; a drain region electrically connected to second intermediate node 482; a channel region between the source region and the drain region; and a gate 461 adjacent to the channel region and electrically connected to first intermediate node 481. Fifth NFET 470 can include at least: a source region connected to ground rail 199; a drain region electrically connected to the source region of fourth NFET 460; a channel region between the source region and the drain region; and a gate 471 adjacent to the channel region and electrically connected to feedback node 483. Optionally, S2 can include: a second output node 403; and another inverter 494, which is connected in series between first intermediate node 481 and second output node 403 and which, like inverter 493, is connected to first voltage rail 191 and ground rail 199.

In operation, when first voltage rail 191 is at VDDH (e.g., 1.8V) and second voltage rail 192 is at VDDL (e.g., 0.8V), switching of data signal 101 received at input node 401 from 0.0V to VDDL results in switching of 1DSs at from 0.0V and VDDH and vice versa.

Specifically, when data signal 101 is at VDDL, the output signal from first additional inverter 491 applied to gate 411 will be at 0.0V so first NFET 411 turns off; whereas the output signal from second additional inverter 492 applied to gate 451 will be at VDDL so third NFET 450 turns on. When first NFET 410 is off and third NFET 450 is on, second intermediate node 482 is pulled low (e.g., to 0.0V). When second intermediate node 482 is low, first PFET 430 turns on and pulls up the voltage level on first intermediate node 481 to VDDH. When first intermediate node 481 is at VDDH and second intermediate node 482 is at 0.0V, output signal from inverter 493 goes high (i.e., to VDDH). Thus, feedback node 483 is at VDDH and so is first level-shifted data signal (1DSs) 122 at output node 402. Additionally, since gates of fourth NFET 460 and fifth NFET 470 are controlled by voltage levels on first intermediate node 481 and feedback node 483 (which are both at VDDH), both of these transistors are turned on to keep the voltage level on second intermediate node 482 stable at 0.0V and, thus, the voltage level at output node 402 remains stable at VDDH.

When data signal 101 is at 0.0V, the output signal from first additional inverter 491 applied to gate 411 is at VDDL and first NFET 410 turns on; whereas the output signal from second additional inverter 492 applied to gate 451 is at 0.0V and third NFET 450 turns off. When first NFET 410 is on and third NFET 450 is off, second intermediate node 482 is pulled high (e.g., to VDDH). When second intermediate node 482 is high, so first PFET 430 turns off and second NFET 420 turns on, the voltage level on first intermediate node 481 is pulled down to 0.0V. When first intermediate node 481 is at 0.0V and second intermediate node 482 is at VDDH, output signal from inverter 493 goes low (i.e., to 0.0V). Thus, feedback node 483 is low and so is first level-shifted data signal (1DSs) 122 at output node 402. Additionally, since gates of fourth NFET 460 and fifth NFET 470 are controlled by voltage levels on first intermediate node 481 and feedback node 483 (which are both at 0.0V), both of these transistors are turned off and, thus, the voltage level at output node 402 remains stable at 0.0V.

As mentioned above and illustrated in FIG. 1 with regard to operation of output driver 100 (as well as in FIGS. 2-3 in combination with regard to operation of first pre-driver 123 and first main driver 125), when first level-shifted data signal (1DSs) 122 is at VDDH, first pre-driver signal(s) 124 output by first pre-driver 123 will be at 0.0V, thereby turning on PFET(s) of first main driver 125 to pull-up boosted data signal (boosted DS) 102 on output pad 150. When first level-shifted data signal (1DSs) 122 is at 0.0V, first pre-driver signal(s) 124 output by first pre-driver 123 will be at VDDH, thereby turning off PFET(s) of first main driver 125.

However, if second voltage rail 192 is still at 0.0V as first voltage rail 191 begins powering up from 0.0V toward VDDH, the voltage levels on both the first and second intermediate nodes 481 and 482 will begin to rise because the power supplies providing power to both first additional inverter 491 and second additional inverter 492 will be off. Thus, the output signals from first additional inverter 491 and second additional inverter 492 will both be low, first NFET 410 and third NFET 450 will both remain off, and voltage levels on first intermediate node 481 and second intermediate node 482 will begin to rise, potentially effecting the functionality of S2. In this case, second NFET 420 functions as a safety pull-down transistor and, more particularly, first PFET 430 and second NFET 420 in combination function as a half latch controlled by the voltage level on second intermediate node 482 to counteract the rise of voltage on first intermediate node 481. Specifically, under these conditions, as the voltage level on second intermediate node 482 rises toward VDDH, it will turn off first PFET 430 and turn on second NFET 420, thereby causing the voltage level on first intermediate node 481 to quickly drop back to 0.0V. As a result, the first level-shifted data signal (1DSs) 122 on output node 402 will go low. Again, when first level-shifted data signal (1DSs) 122 is at 0.0V, first pre-driver signal(s) 124 output by first pre-driver 123 will be at VDDH so PFET(s) of first main driver 125 will remain off (regardless of whether data signal 101 is high or low) until such time as first voltage rail 191 and second voltage rail 192 are powered up.

Additionally, if first intermediate node 481 is at VDDH, second intermediate node 482 is at 0.0V, and first voltage rail 191 is powered up (i.e., at VDDH), as second voltage rail 192 begins powering down toward 0.0V, the output stabilizing transistors 460 and 470 will both be in an on-state such that second intermediate node 482 is maintained at 0.0V, and first level-shifted data signal 122 at output node 402 will remain steady at VDDH. Thus, within output driver 100 of FIG. 1, first pre-driver signal(s) 124 output by first pre-driver 123 will remain low and PFET(s) of first main driver 125 will stay on. Furthermore, if first intermediate node 481 is at 0.0V, second intermediate node 482 is at VDDH, and first voltage rail 191 is at VDDH, as second voltage rail 192 begins powering down toward 0.0V, second NFET 420 remains in an on-state. As a result, first intermediate node 481 will be stable at 0.0V, ensuring that fourth NFET 460 stays off, second intermediate node 482 stays high, and first level-shifted data signal 122 at output node 402 will remain steady at 0.0V. Thus, within output driver 100 of FIG. 1, first pre-driver signal(s) 124 output by first pre-driver 123 will remain high and PFET(s) of first main driver 125 will stay off.

Figures 4A, 4B:
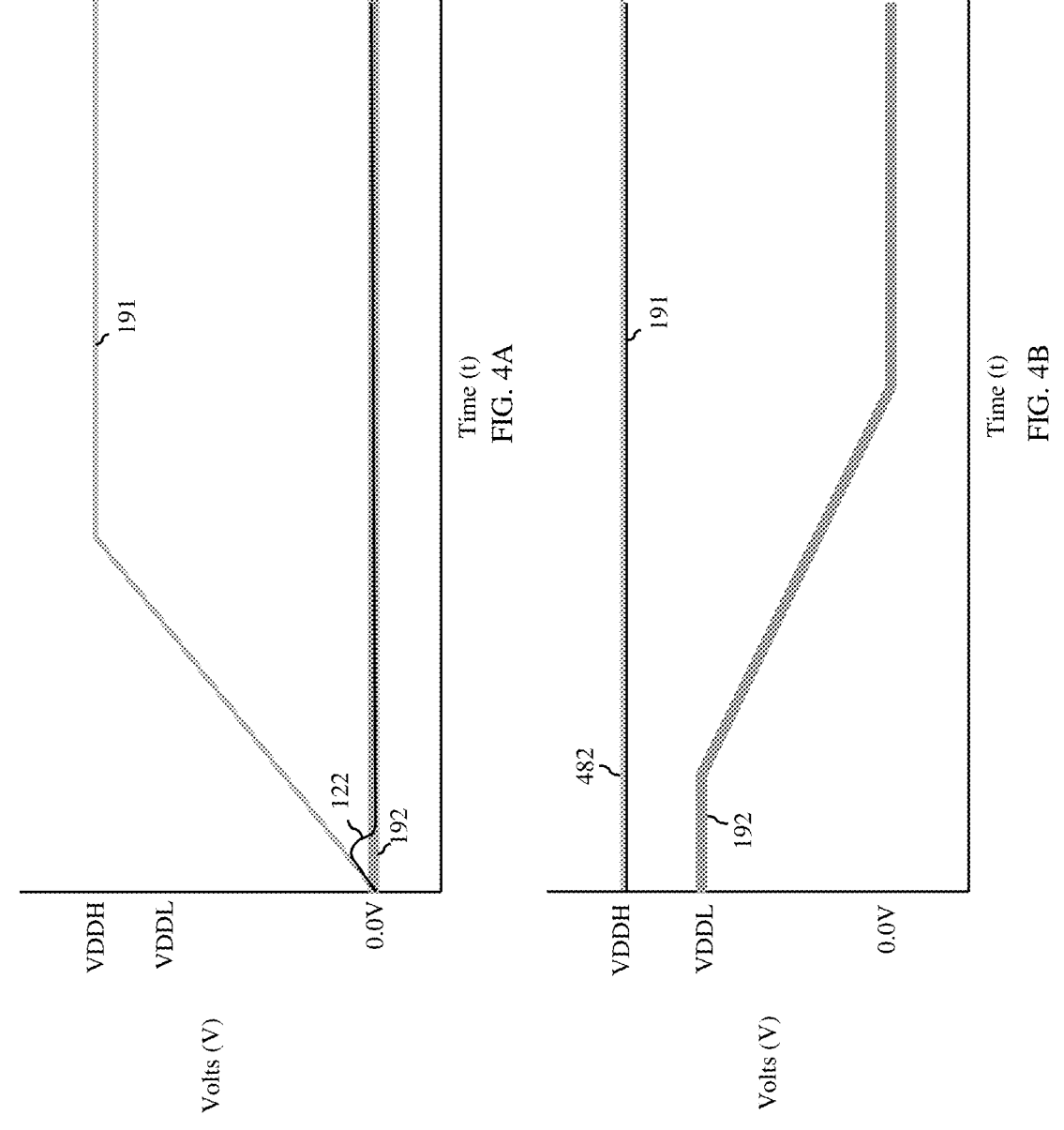
FIGS. 4A-4C are graphs illustrating voltages at specific nodes in the voltage level shifter of FIG. 4 during powering up of a first voltage rail when a second voltage rail is at ground (see FIG. 4A) and during powering down of the second voltage rail when the first voltage rail is charged (see FIGS. 4B and 4C)
Figure 4C:
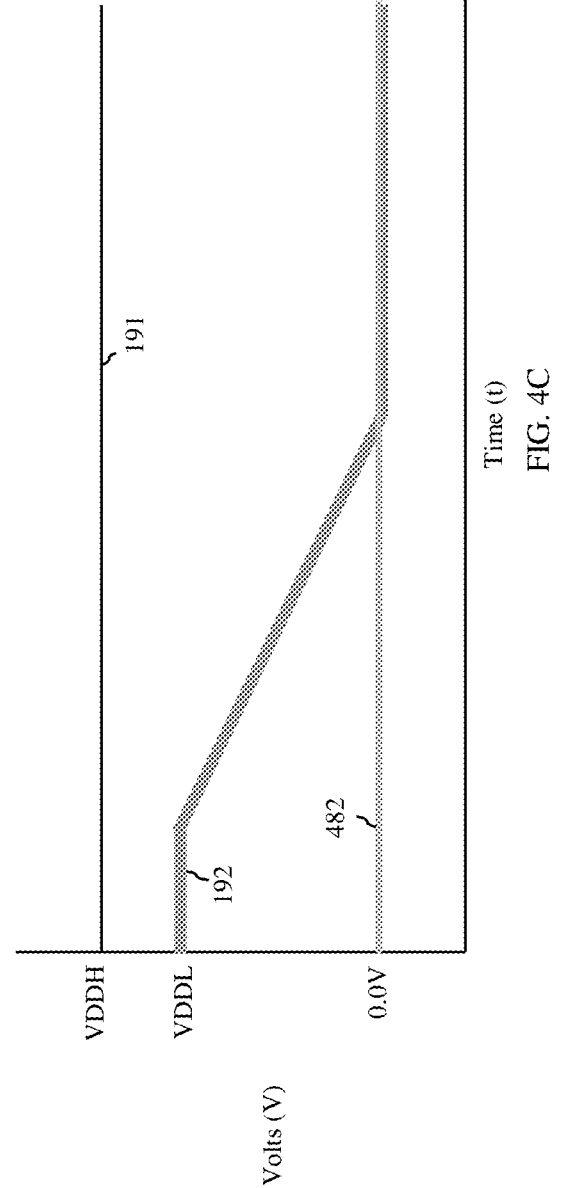

FIGS. 4A-4C are graphs related to operation of first voltage level shifter 121 of FIG. 4. Specifically, FIG. 4A graphically illustrates the voltage level of first level-shifted data signal (1DSs) 122 when first voltage rail 191 is being powered up from 0.0V to VDDH, while second voltage rail 192 is still at 0.0V. As illustrated, except for a small bump in at the beginning of the powering up process, the voltage level of first level-shifted data signal (1DSs) 122 remains steady at 0.0V. FIG. 4B graphically illustrates the voltage level on second intermediate node 482 under the following conditions: first voltage rail 191 is at VDDH; second voltage rail 192 begins powering down from VDDL to 0.0V; and at the start of the powering down process, first intermediate node 481 is 0.0V and second intermediate node is at VDDH. As illustrated, the voltage level of second intermediate node 482 remains steady at VDDH. FIG. 4C graphically illustrates the voltage level on second intermediate node 482 under the following conditions: first voltage rail 191 is at VDDH; second voltage rail 192 begins powering down from VDDL to 0.0V; and at the start of the powering down process, first intermediate node 481 is VDDH and second intermediate node is at 0.0V. As illustrated, the voltage level on second intermediate node 482 remains steady at 0.0V.

Referring to FIG. 5, second voltage level shifter 131 can include an input section (S1) with an input node 501 (also referred to herein as a data signal node or data signal input node) connected to receive data signal 101 (DS) (which switches between 0.0V and VDDL) and an output section (S2) with an output node 502 that outputs a second level-shifted data signal (2DSs) (which switches from 0.0V and VDDH as DS switches from 0.0V and VDDL and vice versa).

S1 can include: a first PFET 530; a second PFET 540; a first NFET 510; a second NFET 520; and a third NFET 550. First PFET 530 can include at least: a source region electrically connected to first voltage rail 191 (which, when powered up is at VDDH); a drain region electrically connected to a first intermediate node 581; a channel region between the source region and the drain region; and a gate 531 adjacent to the channel region. First NFET 510 and second NFET 520 can be connected in parallel between first intermediate node 581 and a ground rail 199. That is, first NFET 510 can include at least: a source region electrically connected to ground rail 199; a drain region electrically connected to first intermediate node 581; a channel region between the source region and the drain region; and a gate 511 adjacent to the channel region. Second NFET 520 can include at least: a source region electrically connected to ground rail 199; a drain region electrically connected to first intermediate node 581; a channel region between the source region and the drain region; and a gate 521 adjacent to the channel region. Second PFET 540 can include at least: a source region electrically connected to first voltage rail 191; a drain region electrically connected to a second intermediate node 582; a channel region between the source region and the drain region; and a gate 541 adjacent to the channel region. Third NFET 550 can include at least: a source region electrically connected to ground rail 199; a drain region electrically connected to second intermediate node 582; a channel region between the source region and the drain region; and a gate 551 adjacent to the channel region.

S1 can further an inverter (referred to herein as additional inverter 592). Additional inverter 592 can be connected between second voltage rail 192 (which, when powered up is at VDDL, and ground rail 199).

Within S1, the gate 511 of first NFET 510 can be electrically connected to a data signal node 501 for receiving data signal (DS) 101 (which, as mentioned above, switches between 0.0V and VDDL). An input terminal of additional inverter 592 can also be electrically connected to data signal node 501, while the output terminal of additional inverter 592 can be electrically connected to the gate 551 of third NFET 550. Additionally, the gate 521 of second NFET 520 and the gate 531 of first PFET 530 can be electrically connected to second intermediate node 582. The gate 541 of second PFET 540 can be electrically connected to first intermediate node 581.

S2 includes: a pair of inverters 593-595, which are electrically connected in series between second intermediate node 582 and output node 502 and which are each connected to first voltage rail 191 and ground rail 199. S2 can also include a feedback node 583 between the output terminal of inverter 593 and input terminal of inverter 595; and two transistors 560 and 570 (also referred to herein as output stabilizing transistors), which are connected in series between second intermediate node 582 and ground rail 199. The output stabilizing transistors can be pull-down transistors and can include a fourth NFET 560 and a fifth NFET 570. Fourth NFET 560 can include at least: a source region; a drain region electrically connected to second intermediate node 582; a channel region between the source region and the drain region; and a gate 561 adjacent to the channel region and electrically connected to first intermediate node 581. Fifth NFET 570 can include at least: a source region connected to ground rail 199; a drain region electrically connected to the source region of fourth NFET 560; a channel region between the source region and the drain region; and a gate 571 adjacent to the channel region and electrically connected to feedback node 583. Optionally, S2 can include: a second output node 503; and another inverter 594, which is connected in series between feedback node 583 and second output node 503 and which, like inverters 593 and 595, is connected to first voltage rail 191 and ground rail 199.

In operation, when first voltage rail 191 is at VDDH (e.g., 1.8V) and second voltage rail 192 is at VDDL (e.g., 0.8V), switching of data signal 101 received at input node 501 from 0.0V to VDDL results in switching of 2DSs at from 0.0V and VDDH and vice versa.

Specifically, when data signal 101 is at 0.0V, first NFET 510 turns off. Output signal from additional inverter 592 applied to gate 551 will go to VDDL so third NFET 550 turns on. When first NFET 510 is off and third NFET 550 is on, second intermediate node 582 is pulled low (e.g., to 0.0V). When second intermediate node 582 is low, first PFET 530 turns on and pulls up the voltage level on first intermediate node 581 to VDDH. When first intermediate node 581 is at VDDH and second intermediate node 582 is at 0.0V, output signal from inverter 593 goes high (i.e., to VDDH). Thus, feedback node 583 will be high. Additionally, output signal from inverter 595 and, thereby second level-shifted data signal (2DSs) 132 at output node 502 will go low (i.e., to 0.0V). Since gates of fourth NFET 560 and fifth NFET 570 are controlled by voltage levels on first intermediate node 581 and feedback node 583 (which are both at VDDH), both of these transistors are turned on to keep the voltage level on second intermediate node 582 stable at 0.0V and, thus, the voltage level at output node 502 remains stable at 0.0V.

When data signal 101 is at VDDL, first NFET 510 turns on; whereas the output signal from additional inverter 592 applied to gate 551 is at 0.0V and third NFET 550 turns off. When first NFET 510 is on and third NFET 550 is off, second intermediate node 582 is pulled high (e.g., to VDDH). When second intermediate node 582 is high, first PFET 530 turns off and second NFET 520 turns on, the voltage level on first intermediate node 581 is pulled down to 0.0V. When first intermediate node 581 is at 0.0V and second intermediate node 582 is at VDDH, output signal from inverter 593 goes low (i.e., to 0.0V). Thus, feedback node 583 is low. Additionally, output signal from inverter 595 and thereby second level-shifted data signal (2DSs) 132 at output node 502 will go high (i.e., to VDDH). Since gates of fourth NFET 560 and fifth NFET 570 are controlled by voltage levels on first intermediate node 581 and feedback node 583 (which are both at 0.0V), both of these transistors are turned off and, thus, the voltage level at output node 502 remains stable at 0.0V.

As mentioned above and illustrated in FIG. 1 with regard to operation of output driver 100 (as well as in FIGS. 2-3 in combination with regard to operation of second pre-driver 133 and second main driver 135), when second level-shifted data signal (2DSs) 132 is at VDDH, second pre-driver signal(s) 134 output by second pre-driver 133 will be at 0.0V, thereby turning off NFET(s) of second main driver 135. When second level-shifted data signal (2DSs) 132 is at 0.0V, second pre-driver signal(s) 134 output by second pre-driver 133 will be at VDDH, thereby turning on NFET(s) in second main driver 135 to pull-down boosted data signal (boosted DS) 102 on output pad 150.

However, if second voltage rail 192 is still at 0.0V as first voltage rail 191 begins powering up from 0.0V toward VDDH, the voltage levels on both the first and second intermediate nodes 581 and 582 will begin to rise because the power supplies that are used to generate data signal 101 and to supply power to additional inverter 592 will be off. Thus, signals applied to gates of first NFET 510 and third NFET 550 will be low, so those transistors will remain off and voltage levels on first intermediate node 581 and second intermediate node 582 will begin to rise, potentially effecting the functionality of S2. In this case, second NFET 520 functions as a safety pull-down transistor and, more particularly, first PFET 530 and second NFET 520 in combination function as a half latch controlled by the voltage level on second intermediate node 582 to counteract the rise of voltage on first intermediate node 581. Specifically, under these conditions, as the voltage level on second intermediate node 582 rises toward VDDH, it will turn off first PFET 530 and turn on second NFET 520, thereby causing the voltage level on first intermediate node 581 to quickly drop back to 0.0V. As a result, the second level-shifted data signal (2DSs) 132 on output node 502 will go high. Again, when second level-shifted data signal (2DSs) 132 is at VDDH, second pre-driver signal(s) 134 output by second pre-driver 133 will be low so NFET(s) of second main driver 135 will remain off (regardless of whether data signal 101 is high or low) until such time as first voltage rail 191 and second voltage rail 192 are powered up.

Additionally, if first intermediate node 581 is at VDDH, second intermediate node 582 is at 0.0V, and first voltage rail 191 is powered up (i.e., at VDDH), as second voltage rail 192 begins powering down toward 0.0V, the output stabilizing transistors 560 and 570 will both be in an on-state such that second intermediate node 582 is maintained at 0.0V, and second level-shifted data signal 132 at output node 502 will remain steady at 0.0V. Thus, within output driver 100 of FIG. 1, second pre-driver signal(s) 134 output by second pre-driver 133 will remain high and NFET(s) of second main driver 135 will stay on. Furthermore, if first intermediate node 581 is at 0.0V, second intermediate node 582 is at VDDH, and first voltage rail 191 is at VDDH, as second voltage rail 192 begins powering down toward 0.0V, second NFET 520 will be maintained in an on-state. As a result, first intermediate node 581 will be stable at 0.0V, ensuring that fourth NFET 560 stays off, second intermediate node 582 stays high, and second level-shifted data signal 132 at output node 502 will remain steady at VDDH. Thus, within output driver 100 of FIG. 1, second pre-driver signal(s) 134 output by second pre-driver 133 will remain low and NFET(s) of second main driver 135 will stay off.

Figures 5A, 5B:
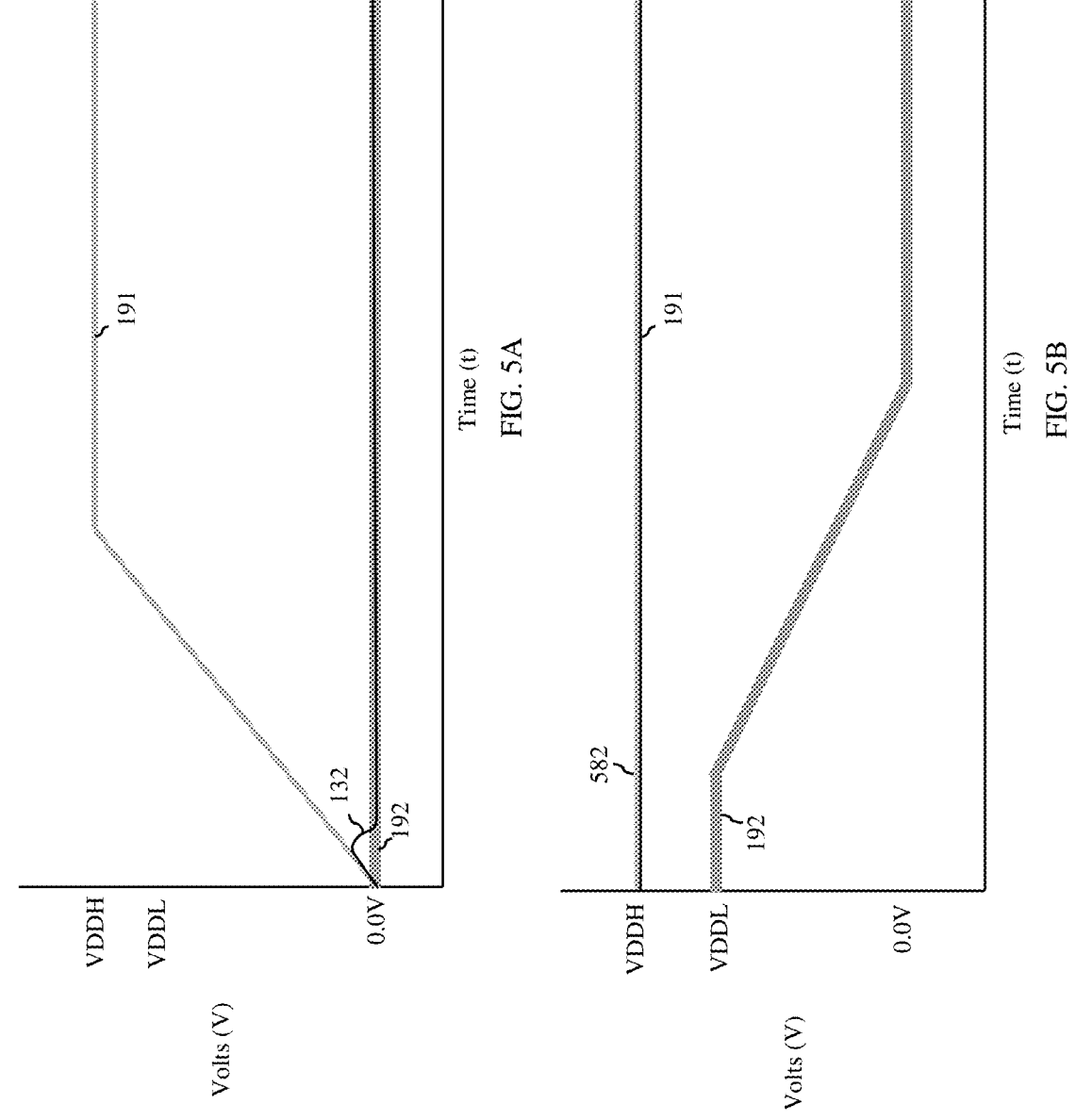
FIGS. 5A-5C are graphs illustrating voltages at specific nodes in the voltage level shifter of FIG. 5 during powering up of a first voltage rail when a second voltage rail is at ground (see FIG. 5A) and during powering down of the second voltage rail when the first voltage rail is charged (see FIGS. 5B and 5C).
Figure 5C:
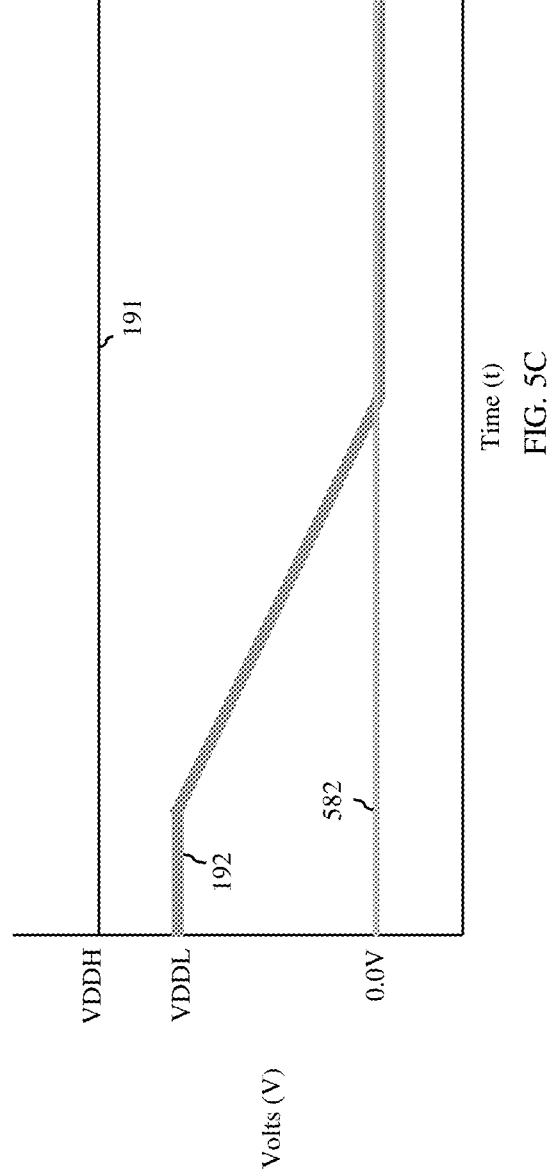

FIGS. 5A-5C are graphs related to operation of second voltage level shifter 131 of FIG. 5. Specifically, FIG. 5A graphically illustrates the voltage level of second level-shifted data signal (2DSs) 132 when first voltage rail 191 begins powering up from 0.0V to VDDH, while second voltage rail 192 is still at 0.0V. As illustrated, except for a small bump at the beginning of the powering up process, the voltage level of second level-shifted data signal (2DSs) 132 remains steady at 0.0V. FIG. 5B graphically illustrates the voltage level on second intermediate node 582 under the following conditions: first voltage rail 191 is at VDDH; second voltage rail 192 begins powering down from VDDL to 0.0V; and at the start of the powering down process, first intermediate node 581 is 0.0V and second intermediate node is at VDDH. As illustrated, the voltage level on second intermediate node 582 remains steady at VDDH. FIG. 5C graphically illustrates the voltage level on second intermediate node 582 under the following conditions: first voltage rail 191 is at VDDH; second voltage rail 192 begins powering down from VDDL to 0.0V; and at the start of the powering down process, first intermediate node 581 is VDDH and second intermediate node is at 0.0V. As illustrated, the voltage level on second intermediate node 582 remains steady at 0.0V.

It should be understood that in the embodiments described above a field effect transistor (FET) is a semiconductor device including a channel region between source/drain regions, a primary gate (also referred to in the art as a front gate) adjacent to the channel region, and, optionally, a secondary gate (also referred to in the art as a back gate) adjacent to the channel region opposite the primary gate. A P-type FET (PFET) can include P-type source/drain regions at a relatively high conductivity level (e.g., P+ source/drain regions) and a channel region that is either an intrinsic (i.e., undoped) channel region or an N-type channel region at a relatively low conductivity level (e.g., a N-channel region). An N-type FET (NFET) can include N-type source/drain regions at a relatively high conductivity level (e.g., N+ source/drain regions) and a channel region that is either an intrinsic (i.e., undoped) channel region or a P-type channel region at a relatively low conductivity level (e.g., a P-channel region). Various different types of FET structures are known in the art and could be incorporated into the disclosed circuit structures. For example, the FETs mentioned above could be bulk semiconductor devices or semiconductor-on-insulator devices, planar semiconductor devices or non-planar semiconductor devices, single gate devices or dual-gate devices, single gate finger devices or multiple gate finger devices, etc.

In some embodiments disclosed herein, voltage level shifters 121, 131 and an output driver 100 incorporating such voltage level shifters could be implemented in any advanced processing technology (e.g., the 12 nm or 130 nm processing technology).

Additionally, it should be understood that in embodiments described above a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface intercon- nections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a dis- play, a keyboard or other input device, and a central pro- cessor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over tech- nologies found in the marketplace, or to enable others of ordinary skill in the art to understand the embodiments disclosed herein.

What is claimed is:

1. A structure comprising:
an input section including: a first intermediate node and a second intermediate node; and
an output section including:
an inverter connected in series between the second intermediate node and a feedback node; and
two transistors connected in series between the second intermediate node and a ground rail, wherein gates of the two transistors are connected to the first inter- mediate node and the feedback node, respectively.

2. The structure of claim 1, wherein the two transistors include N-type field effect transistors (NFETs).

3. The structure of claim 2, wherein the input section includes:
a first P-type field effect transistor (PFET) connected between a first voltage rail and the first intermediate node;
a first N-type field effect transistor (NFET) and a second NFET connected in parallel between the first interme- diate node and the ground rail, wherein gates of the first PFET and the second NFET are connected to the second intermediate node;
a second PFET connected between the first voltage rail and the second intermediate node, wherein a gate of the second PFET is connected to the first intermediate node; and
a third NFET connected between the second intermediate node and the ground rail.

4. The structure of claim 3, wherein the input section further includes:

an input node connected to receive a data signal; and
a first additional inverter and a second additional inverter connected in series between the input node and a gate of the third NFET, wherein a gate of the first NFET is connected to an output of the first additional inverter and wherein the first additional inverter and the second additional inverter are connected to a second voltage rail different from the first voltage rail.

5. The structure of claim 4,
wherein the output section further includes an output node connected to the feedback node,
wherein a first voltage on the first voltage rail is charge- able to a first positive supply voltage level,
wherein a second voltage on the second voltage rail is chargeable to second positive supply voltage level that is lower than the first positive supply voltage level, and
wherein, when the first voltage on the first voltage rail is at the first positive supply voltage level and the second voltage on the second voltage rail is at the second positive supply voltage level, switching of the data signal at the input node between 0.0V and the second positive supply voltage level results in switching of a level-shifted data signal at the output node between 0.0V and the first positive supply voltage level.

6. The structure of claim 5,
wherein the two transistors are output stabilizing transis- tors,
wherein, when the second voltage on the second voltage rail is at 0.0V, the first voltage on the first voltage rail is powering up toward the first positive supply voltage level, and the first NFET and the third NFET are off, voltage levels on the first intermediate node and the second intermediate node begin to rise,
wherein as a voltage level on the second intermediate node rises toward the first positive supply voltage level, the second NFET turns on causing a voltage level on the first intermediate node to drop to 0.0V,
wherein, when the first intermediate node is at 0.0V and the second intermediate node is at the first positive supply voltage level, the level-shifted data signal at the output node is maintained at 0.0V,
wherein, when the first intermediate node is at the first positive supply voltage level, the second intermediate node is at 0.0V, the first voltage on the first voltage rail is at the first positive supply voltage level, and the second voltage on the second voltage rail begins pow- ering down toward 0.0V, the output stabilizing transis- tors stay on, the second intermediate node is main- tained at 0.0V, and the level-shifted data signal at the output node is at the first positive supply voltage level, and
wherein, when the first intermediate node is at 0.0V, the second intermediate node is at the first positive supply voltage level, the first voltage on the first voltage rail is at the first positive supply voltage level, and the second voltage on the second voltage rail begins powering down toward 0.0V, the second NFET is on maintaining the first intermediate node at 0.0V and an output stabilizing transistor controlled by the first intermediate node is off.

7. The structure of claim 3, wherein the input section further includes:
an input node connected to receive a data signal and further connected to a gate of the first NFET; and
an additional inverter connected between the input node and a gate of the third NFET, wherein the additional inverter is connected to a second voltage rail different from the first voltage rail.

8. The structure of claim 7, wherein the output section further includes an output node and another inverter connected between the feedback node and the output node, wherein a first voltage on the first voltage rail is chargeable to a first positive supply voltage level, wherein a second voltage on the second voltage rail is chargeable to a second positive supply voltage level that is lower than the first positive supply voltage level, and wherein, when the first voltage on the first voltage rail is at the first positive supply voltage level and the second voltage on the second voltage rail is at the second positive supply voltage level, switching of the data signal at the input node between 0.0V and the second positive supply voltage level results in switching of a level-shifted data signal at the output node between 0.0V and the first positive supply voltage level.

9. The structure of claim 8, wherein the two transistors are output stabilizing transistors, wherein, when the second voltage on the second voltage rail is at 0.0V, the first voltage on the first voltage rail is powering up toward the first positive supply voltage level, and the first NFET and the third NFET are off, voltage levels on the first intermediate node and the second intermediate node begin to rise, wherein as a voltage level on the second intermediate node rises toward the first positive supply voltage level, the second NFET turns on causing a voltage level on the first intermediate node to drop to 0.0V, wherein, when the first intermediate node is at 0.0V and the second intermediate node is at the first positive supply voltage level, the level-shifted data signal at the output node is maintained at the first positive supply voltage level, wherein, when the first intermediate node is at the first positive supply voltage level, the second intermediate node is at 0.0V, the first voltage on the first voltage rail is at the first positive supply voltage level, and the second voltage on the second voltage rail begins powering down toward 0.0V, the output stabilizing NFETs stay on and the second intermediate node is maintained at 0.0V and the level-shifted data output signal at the output node is maintained at 0.0V, and wherein, when the first intermediate node is at 0.0V, the second intermediate node is at the first positive supply voltage level, the first voltage on the first voltage rail is at the first positive supply voltage level, and the second voltage on the second voltage rail begins powering down toward 0.0V, the second NFET is on maintaining the first intermediate node at 0.0V and an output stabilizing transistor controlled by the first intermediate node is off.

10. A structure comprising:

a pull-up path connected to an output pad and including a first voltage level shifter, a first pre-driver, and a first main driver; and a pull-down path connected to the output pad and including a second voltage level shifter, a second pre-driver, and a second main driver, wherein the first voltage level shifter and the second voltage level shifter each include:

an input section including; a first intermediate node; and a second intermediate node; and an output section including:

an inverter connected in series between the second intermediate node and a feedback node; and two transistors connected in series between the second intermediate node and a ground rail, wherein gates of the two transistors are connected to the first intermediate node and the feedback node, respectively.

11. The structure of claim 10, wherein the two transistors include N-type field effect transistors (NFETs).

12. The structure of claim 11, wherein the input section includes:

a first P-type field effect transistor (PFET) connected between a first voltage rail and the first intermediate node;

a first N-type field effect transistor (NFET) and a second NFET connected in parallel between the first intermediate node and the ground rail, wherein gates of the first PFET and the second NFET are connected to the second intermediate node;

a second PFET connected between the first voltage rail and the second intermediate node, wherein a gate of the second PFET is connected to the first intermediate node; and a third NFET connected between the second intermediate node and the ground rail.

13. The structure of claim 12, wherein the input section of the first voltage level shifter further includes:

an input node connected to receive a data signal; and a first additional inverter and a second additional inverter connected in series between the input node and a gate of the third NFET, wherein a gate of the first NFET is connected to an output of the first additional inverter and wherein the first additional inverter and the second additional inverter are connected to a second voltage rail different from the first voltage rail.

14. The structure of claim 13, wherein the output section of the first voltage level shifter further includes an output node connected to the feedback node and to the first pre-driver, wherein a first voltage on the first voltage rail is chargeable to a first positive supply voltage level, wherein a second voltage on the second voltage rail is chargeable to a second positive supply voltage level that is lower than the first positive supply voltage level, and wherein, within the first voltage level shifter, when the first voltage on the first voltage rail is at the first positive supply voltage level and the second voltage on the second voltage rail is at the second positive supply voltage level, switching of the data signal at the input node between 0.0V and the second positive supply voltage level results in switching of a first level-shifted data signal at the output node between 0.0V and the first positive supply voltage level.

15. The structure of claim 14, wherein, within the first voltage level shifter, when the second voltage on the second voltage rail is at 0.0V, the first voltage on the first voltage rail is powering up toward the first positive supply voltage level, and the first NFET and the third NFET are off, voltage levels on the first intermediate node and the second intermediate node begin to rise, as a voltage level on the second intermediate node rises toward the first positive supply voltage level, the second NFET turns on causing a voltage level on the first intermediate node to drop to 0.0V, and when the first intermediate node is at 0.0V and the second intermediate node is at the first positive supply voltage level, the first level-shifted data signal received by the first pre-driver is maintained at 0.0V so that each inverted first level-shifted data signal output by the first pre-driver to each PFET in the first main driver, respectively, is at the first positive supply voltage level.

16. The structure of claim 14, wherein the two transistors are output stabilizing transistors, and wherein, within the first voltage level shifter, when the first intermediate node is at the first positive supply voltage level, the second intermediate node is at 0.0V, the first voltage on the first voltage rail is at the first positive supply voltage level, and the second voltage on the second voltage rail begins powering down toward 0.0V, the output stabilizing transistors stay on, the second intermediate node is maintained at 0.0V, and the first level-shifted data signal received by the first pre-driver is at the first positive supply voltage level, and when the first intermediate node is at 0.0V, the second intermediate node is at the first positive supply voltage level, the first voltage on the first voltage rail is at the first positive supply voltage level, and the second voltage on the second voltage rail begins powering down toward 0.0V, the second NFET is on maintaining the first intermediate node at 0.0V and an output stabilizing transistor controlled by the first intermediate node is off.

17. The structure of claim 13, wherein the input section of the second voltage level shifter further includes:

an input node connected to receive a data signal and further connected to a gate of the first NFET; and an additional inverter connected between the input node and a gate of the third NFET, wherein the additional inverter is connected to a second voltage rail different from the first voltage rail.

18. The structure of claim 17, wherein the output section of the second voltage level shifter further includes an output node connected to the second pre-driver and another inverter connected between the feedback node and the output node, wherein a first voltage on the first voltage rail is chargeable to a first positive supply voltage level, wherein a second voltage on the second voltage rail is chargeable to a second positive supply voltage level that is lower than the first positive supply voltage level, and wherein, within the second voltage level shifter, when the first voltage on the first voltage rail is at the first positive supply voltage level and the second voltage on the second voltage rail is at the second positive supply voltage level, switching of the data signal at the input node between 0.0V and the second positive supply voltage level results in switching of a second level-shifted data signal at the output node between 0.0V and the first positive supply voltage level.

19. The structure of claim 18, wherein, within the second voltage level shifter:

when the second voltage on the second voltage rail is at 0.0V, the first voltage on the first voltage rail is powering up toward the first positive supply voltage level, and the first NFET and the third NFET are off, voltage levels on the first intermediate node and the second intermediate node begin to rise, as a voltage level on the second intermediate node rises toward the first positive supply voltage level, the second NFET turns on causing a voltage level on the first intermediate node to drop to 0.0V, and when the first intermediate node is at 0.0V and the second intermediate node is at the first positive supply voltage level, the second level-shifted data signal received by the second pre-driver is maintained at the first positive supply voltage level so that each inverted second level-shifted data signal output by the second pre-driver to each NFET in the second main driver, respectively, is at 0.0V.

20. The structure of claim 18, wherein the two transistors are output stabilizing transistors, and wherein, within the second voltage level shifter:

when the first intermediate node is at the first positive supply voltage level, the second intermediate node is at 0.0V, the first voltage on the first voltage rail is at the first positive supply voltage level, and the second voltage on the second voltage rail begins powering down toward 0.0V, the output stabilizing transistors stay on, the second intermediate node is maintained at 0.0V, and the second level-shifted data output signal received by the second pre-driver is maintained at 0.0V, and when the first intermediate node is at 0.0V, the second intermediate node is at the first positive supply voltage level, the first voltage on the first voltage rail is at the first positive supply voltage level, and the second voltage on the second voltage rail begins powering down toward 0.0V, the second NFET is on maintaining the first intermediate node at 0.0V and at least an output stabilizing transistor controlled by the first intermediate node is off.

* * * * *